United States Patent [19]
Mitani et al.
[11] Patent Number: 4,743,205
[45] Date of Patent: May 10, 1988

[54] FEMALE COAXIAL CONNECTOR AND METHOD OF MAKING THE SAME

[75] Inventors: Ikujiro Mitani; Fumio Kobayashi; Norihide Kawanami, all of Tokyo, Japan

[73] Assignee: Hirose Electric Co., Ltd., Tokyo, Japan

[21] Appl. No.: 30,591

[22] Filed: Mar. 27, 1987

[30] Foreign Application Priority Data

Apr. 6, 1986 [JP] Japan ............................... 61-128040

[51] Int. Cl.$^{4}$ ............................................. H05K 1/00

[52] U.S. Cl. ..................................... 439/78; 439/843; 439/844; 439/852; 439/675

[58] Field of Search ............... 439/733, 741, 742, 743, 439/750, 598, 601, 580, 581, 582, 583, 584, 585, 578, 885, 819, 821, 823, 833, 875, 878, 884, 847, 851, 852, 853, 854, 855, 78, 843, 844; 29/874, 876, 862

[56] References Cited

U.S. PATENT DOCUMENTS

| | | | |
|---|---|---|---|
| 2,180,923 | 11/1939 | Del Camp | 439/578 |
| 3,452,323 | 6/1969 | Bowley et al. | 439/578 |
| 3,699,504 | 10/1972 | Huber | 439/585 |
| 4,083,623 | 4/1978 | Lynch | 439/741 |
| 4,426,127 | 1/1984 | Kubota | 439/851 |
| 4,493,527 | 1/1985 | Piscitelli et al. | 439/852 |
| 4,583,290 | 4/1986 | Hemmer | 439/852 |

*Primary Examiner*—Gil Weidenfeld
*Assistant Examiner*—David Pirlot
*Attorney, Agent, or Firm*—Yusuke Takeuchi

[57] ABSTRACT

A female coaxial connector having a substantially cylindrical conductive shell with an opening for receiving the columnar connecting portion of a male coaxial connector, which comprises a female contacting portion provided within the opening and having at least one pair of contact fingers extending in the circumferential direction so as to give elasticity and defining a clearance communicating with the opening, and a protective member provided in contact with or in the proximity of the outside of the female contacting portion for the protection thereof. A method of making a female coaxial connector, which comprises the steps of stamping conductive shells and protective members in integral form, folding the integral conductive shell and protective member at a bend to form a double structure, and making the double structured conductive shell and protective member into cylindrical form, followed by the insertion of an assembly of a dielectric body and a female terminal into the conductive shell.

8 Claims, 4 Drawing Sheets

FIG. 3
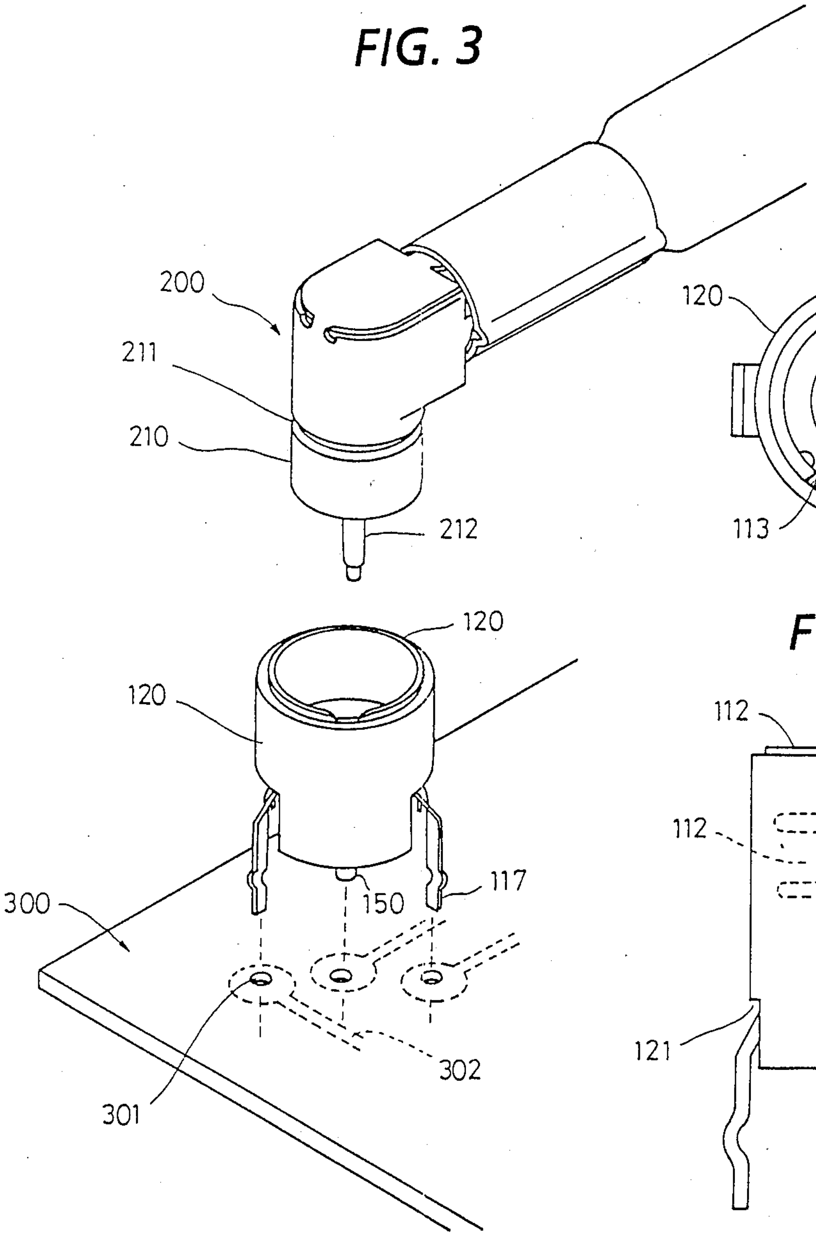
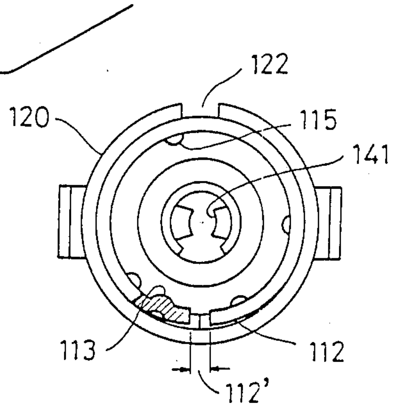
FIG. 1A
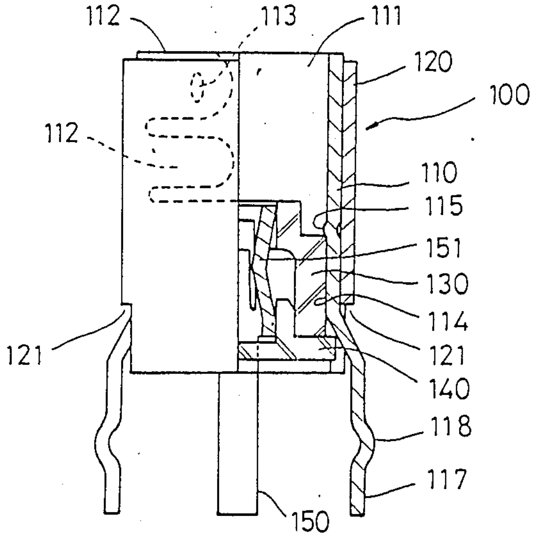
FIG. 1B
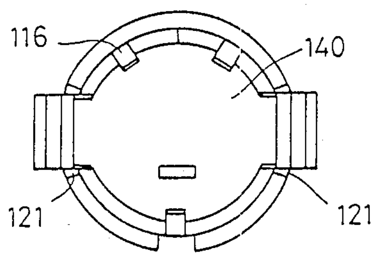
FIG. 1C

FEMALE COAXIAL CONNECTOR AND METHOD OF MAKING THE SAME

BACKGROUND OF THE INVENTION

1. Field of the Invention

This invention relates generally to coaxial connectors, more particularlly to a female connector having conductive shell and a protective member, and a method of making such a female connector.

2. Description of the Prior Art

Female coaxial connectors of such a type are disclosed in Japanese U.M. Patent Kokai No. 59-138184. These connectors have a cylindrical conductive shell for receiving a mating male connector to make an electrical connection. This cylindrical conductive shell has a plurality of open slits so that it may have sufficient elasticity to receive a mating male connector. However, the female coaxial connectors of this type have the following disadvantages:

(1) Since the slits of the conductive shell are provided in the axial direction, the mating male connector must be wrenched in the radial direction into the female conductive shell for connection or disconnection. This deforms the shell, resulting in a poor connection. When the wrenching force exceeds the allowed limits of its material, the shell undergoes plastic deformation or even breakdown.

(2) The conductive shell is contracted toward its open end with the aid of slits so that it may fit tightly over the male connector. However, this is a liner contact at the upper circumference of the female conductive shell, resulting in a very unstable contact.

(3) The cutting of slits on the circumference of the conductive shell requires high precision. Consequently, it needs a complex cutting process, making its mass production process impossible or very expensive if possible at all.

(4) After the cutting, the open end of the contacting portion must be contracted manually with a contracting tool to give elasticity to the connecting portion. This is unsuited to its mass production, thus raising its manufacturing cost. In addition, the product quality is very unstable; the force for connection or disconnection or the contact strength varies from connector to connector resulting from the manual contracting operation.

(5) The connecting portion of the external conductor has no locking means for the mating connector. Consequently, there is a danger of disconnection due to the pull or vibration or impact applied to the cable, resulting in the lower connector reliability.

(6) The lists provided on the connecting prortion of the external conductor cause a leak of electromagnetic waves, degrading the electrical characteristics of the connector.

SUMMARY OF THE INVENTION

It is an object of the invention to provide a female coaxial connector having double-structured cylindrical conductive shells, with the inner shell having elasticity in the circumferential direction and the outer shell formed so as to protect the inner shell from being deformed by an excessive connection or disconnection force.

It is another object of the invention to provide a female coaxial connector having an conductive shell made of a sheet of metal by stamping for easy manufacture.

It is still another object of the invention to provide a female coaxial connector which is stable in contact with a mating male connector at the time of connection or disconnection.

It is yet another object of the invention to provide a female coaxial connector having a large contact area.

It is another object of the invention to provide a method of making such a connector as described above.

According to one aspect of the invention there is provided a female coaxial connector having a substantially cylindrical conductive shell with an opening for receiving the columnar connecting portion of a male coaxial connector, which comprises a female contacting portion provided within the opening and having at least one pair of contact fingers extending in the circumferential direction so as to give elasticity and defining a clearance communicating with the opening, and a protective member provided in contact with or in the proximity of the outside of the female contacting portion for protection.

According to another aspect of the invention there is provided a method of making a female coaxial connector having a substantially cylindrical conductive shell with an opening for receiving the columnar connecting portion of a male coaxial connector, which includes a female contacting portion provided within the opening and having at least one pair of contact fingers extending in the circumferential direction so as to give elasticity and defining a clearance communicating with the opening, and a protective member provided in contact with or in the proximity of the outside of the female contacting portion for protection, which comprises the steps of stamping successively conductive shells and protective members out of a sheet of metal; making successively said stamped conductive shells and protective members into cylinders; and fitting said conductive shell over an assembly of a dielectric body and a female terminal to complete a female connector.

Other objects, features, and advantages of the invention will be more apparent from the following description in conjunction with the accompanying drawings.

BRIEF DESCRIPTION OF THE DRAWINGS

FIGS. 1A, 1B and 1C are top, side partially in section, and bottom views of a female coaxial connector embodying the present invention.

FIG. 3 is a perspective view of the connector of FIG. 1 in application.

DESCRIPTION OF THE PREFERRED EMBODIMENTS

Figure 2:
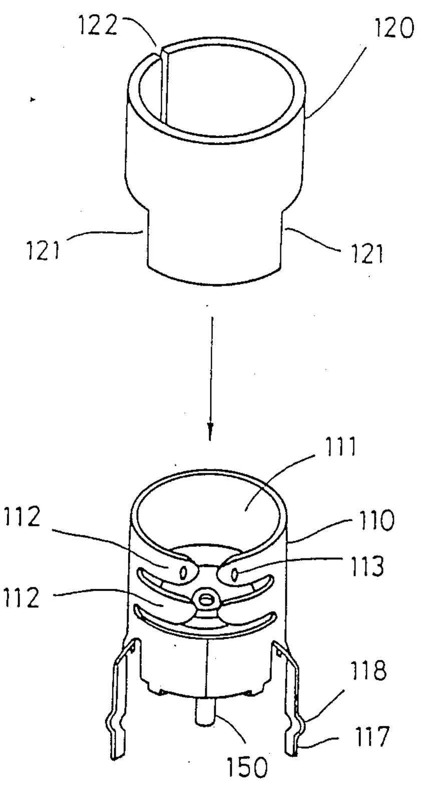
FIG. 2 is a perspective view of the conductive shell and the protective member of FIG. 1 before assembly.

Referring now to FIGS. 1 through 3 there is shown the first embodiment of the invention, wherein a female coaxial connector 100 is adapted to be mounted on a printed circuit board, and a mating male coaxial connector 200 has a substantially L-shaped form (FIG. 3). The female coaxial connector 100 has a substantially cylindrical conductive shell 110 stamped out of a sheet of metal, a substantially cylindrical protective member 120 similarly stamped out of a sheet of metal so as to surrounding the conductive shell 110, and first and second dielectric bodies 130 and 140 at the lower space of the conductive shell 110. A female terminal 150 made of elastic metal extends downward through the center of the first and second dielectric bodies 130 and 140.

The conductive shell 110 has an upper opening 111 for receiving the connecting portion 210 of a mating male coaxial connector 200. Also, it has two pairs of contact fingers 112 extending in the circumferential direction toward each other with a clearance 112' communicating with the opening 111 so as to give elasticity in the circumferential direction. A pair of the upper contact fingers have a locking boss 113 at its tip to engage an annular locking groove 211 provided on the connecting portion of a mating connector. The conductive shell 110 has a lower cylindrical portion 114 below the clearance 112' to hold the first and second dielectric bodies 130 and 140 to which the female terminal 150 is secured. The cylindrical portion 114 has a pair of legs 117 to be inserted and connected to the apertures 301 of a PC board 300.

A plurality of bosses 115 are provided on the upper part of the cylindrical portion 114 to prevent the first dielectric body 120 from coming off upward in the axial direction. A plurality of tabs 116 are also provided on the lower edge of the cylindrical portion 114 to prevent the second dielectric body 140 from falling off. The terminal leg 117 has at its middle a projection 118 for temporary holding when it is inserted into the aperture 301 of a board 300.

As best shown in FIG. 2, the protective member 120 is designed to fit over the conductive shell 110. It has a substantially cylindrical form, with a slit 122 for giving elasticity. Its inside diameter is made slightly smaller than the outside diameter of the conductive shell 110 so that the protective member 120 may be press fitted over the conductive shell 110. A pair of rectangular cuts 121 are provided on the lower part of the shell protective member to avoid any interference with the terminal legs 117 of the conductive shell 110. The female terminal 150 has an elastic contact 151 for making an electrical connection with the male terminal 212.

In application, as FIG. 3 shows, the terminal legs 117 and the female terminal 150 of a female coaxial connector 100 are inserted into apertures 301 of the PC board 300 and soldered to an electrical circuit 302 on the backside of the board for making electrical connection. As a result, the female coaxial connector 100 is secured to the board 300. Then, a male coaxial connector 200 is fitted into the opening 111 of the conductive shell 110 of the female coaxial connector 100. The male terminal 212, to which a coaxial cable is connected, comes into contact with the female terminal 150 while the locking bosses 113 of the female contact fingers 112 engage with the circular groove 211 of the connecting portion 210 to lock the connection between the female and male connectors. Thus, even if the male connector is wrenched into the female connector 100, the female contact fingers 112 are protected by the protective member 120 so that they are prevented from expanding beyond their limits and losing their elasticity.

FIGS. 4 through 8 illustrate a process for making the afore-mentioned female coaxial connector 100. It will be described in sequential order.

Figure 4:
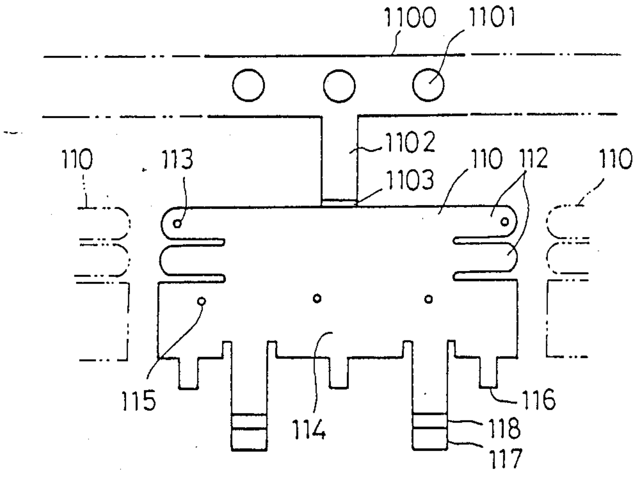
FIG. 4 is an elevational view of the conductive shell stamped out of a flat metal sheet.

(1) As FIG. 4 shows, the conductive shell 110 is stamped out of a continuous metal sheet. A connection strip 1100 is provided at the upper ends of conductive shells 110 to make their mass production possible. This connection strip has a plurality of guiding holes 1101 and connecting parts 1102 for connecting to the strip and moving conductive shells 110. In this way, a number of conductive shells 110 are arranged along the strip 1100.

Figure 5:
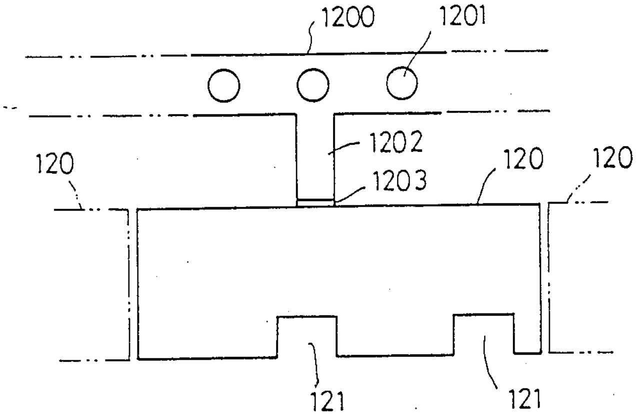
FIG. 5 is an elevational view of the protective member stamped out of a flat sheet.

(2) As FIG. 5 shows, the protective member 120 is also stamped out of a metal sheet together with a connection strip 1200 left. The strip has a plurality of guiding holes 1201 and connecting parts 1202 for connecting the protective members to the strip.

Figure 6:
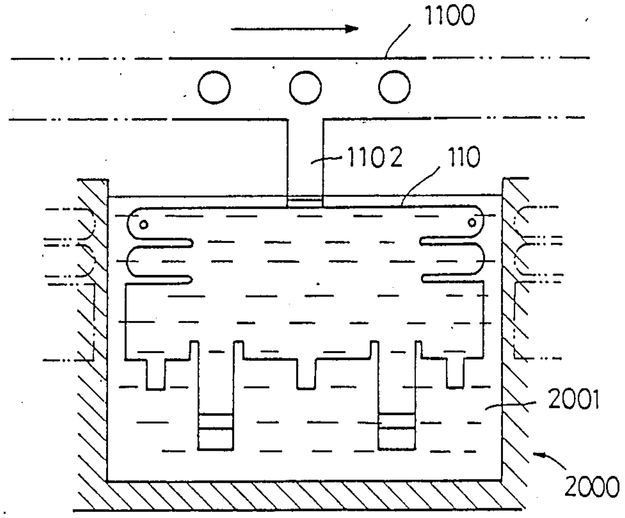
FIG. 6 is a sectional view of a plating tank in which the conductive shell of FIG. 4 is dipped.
Figure 7:
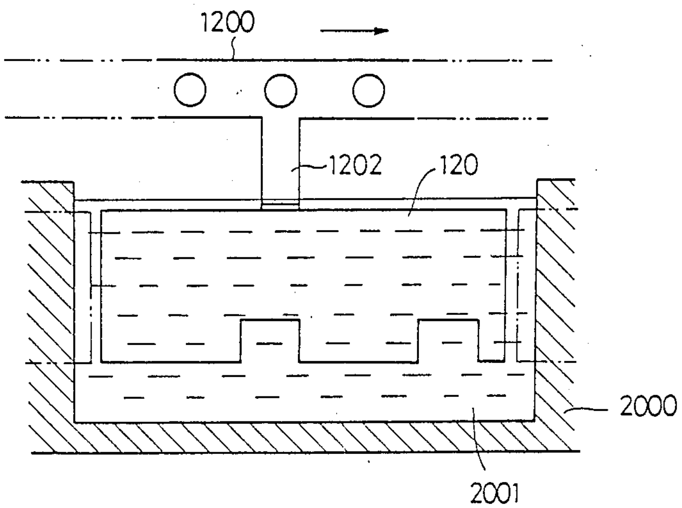
FIG. 7 is a sectional view of a plating tank in which the protective member of FIG. 5 is dipped.

(3) As FIGS. 6 and 7 show, the conductive shells 110 and protective members 120 are dipped in the plating liquid 2001 of a plating tank 2000, respectively. It is preferred to apply plating to only the necessary portions of the conductive shells and the protective members. Alternatively, this plating step may be applied following the cylinder making step hereinafter described.

Figure 8A:
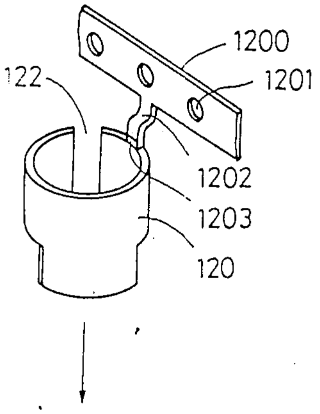
FIGS. 8A, 8B, and 8C are perspective views of the protective member, the conductive shell, and the dielectric block, respectively, before assembling.
Figure 8B:
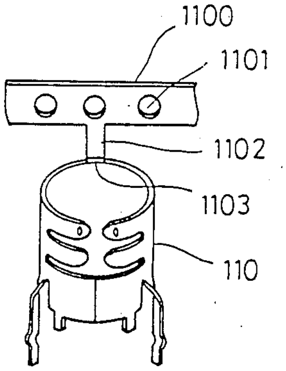

(4) As FIGS. 8A and 8B show, the plated conductive shells 110 and protective members 120 are made into cylinders by means of a press. If plating is not applied yet, it is preferred to do so here following the cylinder making process.

Figure 8C:
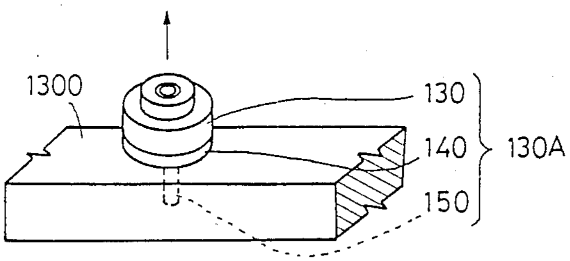

(5) As FIGS. 8A, 8B, and 8C show, there are provided from top to bottom the protective members 120 connected to the strip 1200, the conductive shells 110 connected to the strip 1100, and a block 130A consisting of the first and second dielectric bodies and a female terminal 150 mounted on a movable table 1300.

(6) The movable table 1300 is then elevated so that the block 130A may be fitted into the conductive shell 110. The tabs 116 are then bent inward to prevent the block from falling off. Alternatively, this step may be made after the next step.

(7) The protective member 120 is then fitted over the conductive shell 110. The width of a slit 122 of the protective member 120 should be made larger than the width of a connecting part 1102 of the conductive shell 110 so that the slit may serve as a guide for fitting over of the protective member.

(8) Finally, the protective member 120 and the conductive shell 110 are separated from the respective connecting strips 1100 and 1200 by bending the connecting parts 1102 and 1202 at the notches 1103 and 1203, completing the assembly of a female coaxial connector.

Alternatively, the use of an already plated sheet of metal in the stamping step (1) can eliminate the plating step (3) after the stamping, thus reducing the number of steps and manufacturing cost. It also makes the continuous assembly process possible. Since the assembly of large numbers of conductive shells and protective members can be possible in the final step, they are suited to mass production.

Figure 9:
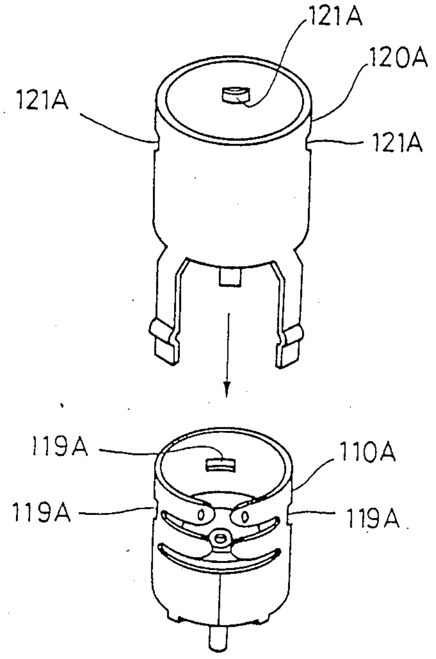
FIG. 9 is a perspective view of a protective member and a conductive shell according to the second embodiment of the present invention.

FIG. 9 shows another embodiment of the invention. Three locking holes 119A are spaced with substantially equal intervals in the circumferential direction on the middle of the conductive shell 110A for receiving three locking projections 121A provided on the protective member 120A at the positions corresponding to the three locking holes 119A to lock the engagement between the conductive shell 110A and the protective member 120A. This prevents the conductive shell 110A from falling off from the protective member 120A even if accidental vibration or impact is applied to the mated connectors.

Figure 10A:
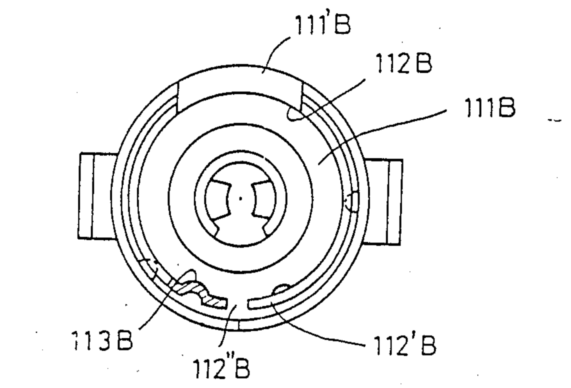
FIGS. 10A and 10B are top and side, partially in section, of a connector according to the third embodiment of the invention.
Figure 10B:
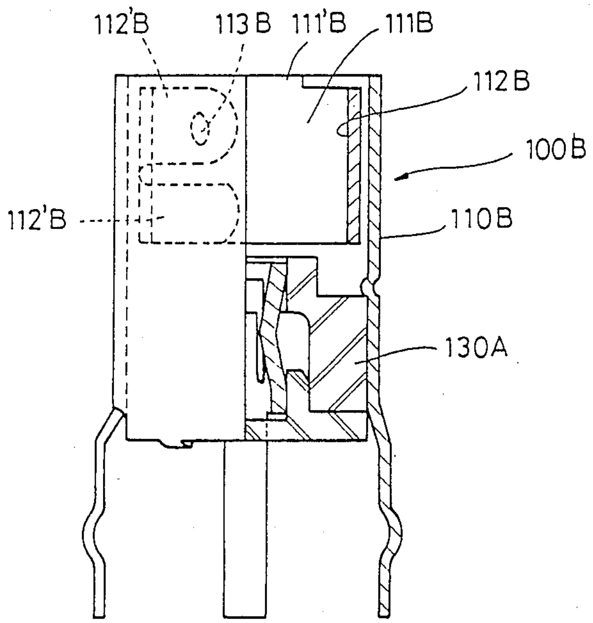

FIG. 10 illustrates the third embodiment of the invention. In the afore-mentioned second embodiment, the conductive shell and the protective member are separately stamped out and then assembled. However, this method have many steps, raising the manufacturing cost. To prevent this, in this embodiment, the conductive shell and the protective member are stamped out of the same sheet in integrated form. More specifically, the conductive shell 110B has a female contact 112B connected thereto through a bend 111'B within the opening 111B. Similarly to the afore-mentioned embodiment, the female contact 112B has a clearance 112"B communicating with the opening 111B. This clearance is defined by two pairs of contacting fingers 112'B, with a locking boss 113B provided on the tip of each upper finger. Thus, the conductive shell 110B serves as a protective member for the contact portion or female contact 112B.

A process for making such a female coaxial connector will be described.

(1) The conductive shell 110B is stamped out of a continuous metal sheet, together with an integral contact portion 112B.

(2) The stamped out sheet is dipped in a plating bath for plating.

(3) The bend 111'B of the conductive shell 110B is bent by 180 degrees toward the opening 111B by means of a press.

(4) The conductive shell 110B is then made into a cylindrical form.

(5) A block 130A is assembled into the conductive shell 110B to complete a female coaxial connector 100B.

Figure 11A:
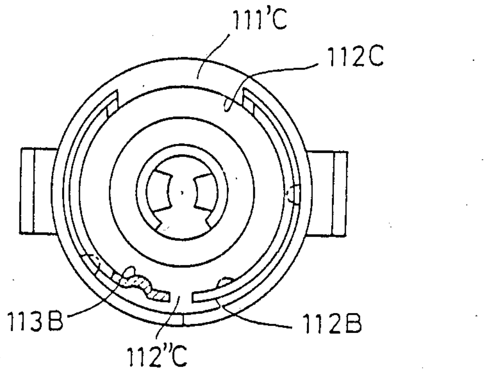
FIGS. 11A and 11B are top and side, partially in section, of a connector according to the fourth embodiment of the invention.
Figure 11B:
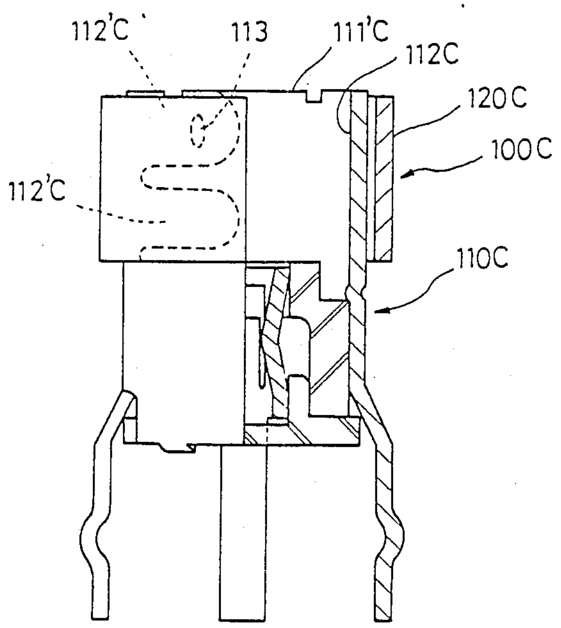

FIG. 11 shows the fourth embodiment of the invention. In contrast to the third embodiment of FIG. 10, a protective member 120C is bent outside so as to form a substantially cylindrical shape surrounding and connecting with the female contact portion 112C through a bend 111'C. This form is similar to the one in which the conductive shell and protective member of the first embodiment in FIG. 1 are integrated into one body, so that the protective member 120C may cover the conductive shell 110C.

Compared with the other embodiments, the third and fourth embodiments of FIGS. 10 and 11 have the following advantages: Since the conductive shell and protective member are integrated, the stamping steps can be integrated, reducing the number of process steps. It resulting in the smaller number of parts, the reduced manufacturing cost, and the more sophisticated mass production process. The smaller number of parts will raise the product reliability, too.

According to the invention there are provided the following advantages:

(1) Since the cylindrical protective member is fitted over the conductive shell with contact fingers extending in the circumferential direction, when the mating male connector is wrenched into or out of the female conductive shell or a foreign object accidentally hits the connector, the contacts are protected from undergoing plastic deformation beyond their elastic limits. Thus, the otherwise resulting poor contact can be prevented.

(2) Since the clearance of the contacting portion is covered by the protective member, there is no or little leakage of electromagnetic waves, resulting in the improved electrical characteristics.

(3) Since the conductive shell and protective member can continuously be made of a sheet of metal, the continuous assembly of connectors is possible, making their mass production possible, thus resulting in the reduced manufacturing cost.

(4) The precision of processing the conductive shells and protective members is not necessarily so high that the ordinary level of stamping precision is satisfactory, thus providing further cost reduction.

While the present invention has been illustrated and described in conjunction with the embodiments thereof, it is understood that numerous changes and modifications may be resorted to without departing from the spirit and scope of the present invention as defined in the appended claims.

What is claimed is:

1. A female coaxial connector comprising:

a central female terminal;

a dielectric body for supporting said central female terminal;

a cylindrical conductive shell made of a sheet of metal so as to have a top opening for receiving a columnar connecting portion of a mating male coaxial connector and a bottom opening for receiving said dielectric body;

a female contacting portion provided within said top opening and having at least one pair of spring contact fingers extending toward each other in a circumferential direction of said conductive shell; and a cylindrical protective member made of a sheet of metal so as to surround at least said female contacting portion for protecting it.

2. A female coaxial connector according to claim 1, wherein said contacting portion and said protective member are made separately.

3. A female coaxial connector according to claim 2, wherein said protective member has at least one locking member to prevent said contacting portion from falling off from said protective member.

4. A female coaxial connector according to claim 1, wherein said contacting portion and said protective member are made integral with a bend portion extending along and between circumferences of said cylindrical conductive shell and said cylindrical protective member.

5. A female coaxial connector according to claim 4, wherein said bend is bent inward by nearly 180 degrees from said protective member so that said contacting portion may be formed inside said protective member.

6. A female coaxial connector according to claim 4, wherein said bend is bent outward by nearly 180 degrees from said contacting portion so that said protective member may be formed outside said contacting portion.

7. A method of making a female coaxial connector, which comprises the steps of:

stamping out of a sheet of metal a series of conductive shell flat elements each connected to a first connecting strip and having at least one pair of spring contact fingers extending along said first connecting strip and a series of protective member flat elements each connected to a second connecting strip;

forming each of said series of conductive shell flat elements into a cylindrical conductive shell so that said spring contacting fingers extend in a circumferential direction of said cylindrical conductive shell and each of said protective member flat elements into a cylindrical protective member, respectively;

fitting each of said cylindrical conductive shells over a columnar assembly of a dielectric body and a central female terminal; and fitting each of said cylindrical protective members over each of said cylindrical conductive shells to complete a series of protected female coaxial connector.

8. A method of making protected female coaxial connectors in volume, which comprises the steps of:

stamping a series of integral flat elements each connected to a connecting strip and having a conductive shell portion with at least one pair of spring contacting fingers extending along said connecting strip and a protective member portion integral with said conductive shell portion through a bend;

folding each of said integral flat elements at said bend to form a double structured flat element;

forming said double structured flat element into a cylindrical conductive shell with said spring contacting fingers extending in a circumferential direction of said cylindrical conductive shell and a cylindrical protective member surrounding at least said spring contacting fingers, respectively; and fitting each of said cylindrical conductive shells over an assembly of a dielectric body and a central female terminal to complete a series of protected female connectors.

* * * * *